(12) United States Patent
Okuda et al.

(10) Patent No.: US 9,093,274 B2
(45) Date of Patent: Jul. 28, 2015

(54) METHOD OF MANUFACTURING SEMICONDUCTOR DEVICE USING INERT, MATERIAL, AND OXIDATION-REDUCTION GASES

(71) Applicant: Kabushiki Kaisha Toshiba, Minato-Ku, Tokyo (JP)

(72) Inventors: Shinya Okuda, Mie-ken (JP); Ichiro Mizushima, Mie-ken (JP); Kie Watanabe, Mie-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 14/194,952

(22) Filed: Mar. 3, 2014

(65) Prior Publication Data

US 2015/0093885 A1 Apr. 2, 2015

(30) Foreign Application Priority Data

Sep. 30, 2013 (JP) ................................. 2013-205883

(51) Int. Cl.
*H01L 21/02* (2006.01)
(52) U.S. Cl.
CPC ...... *H01L 21/0262* (2013.01); *H01L 21/02532* (2013.01); *H01L 21/02592* (2013.01); *H01L 21/02664* (2013.01)

(58) Field of Classification Search
None
See application file for complete search history.

(56) References Cited

U.S. PATENT DOCUMENTS

2011/0207302 A1* 8/2011 Wang et al. ................... 438/486
2012/0142172 A1* 6/2012 Fox et al. ...................... 438/488

FOREIGN PATENT DOCUMENTS

| JP | 2010-168870 A | 8/2010 |
| JP | 2010-206223 A | 9/2010 |
| JP | 2011-168870 A | 9/2011 |
| JP | 2011-176095 A | 9/2011 |

* cited by examiner

*Primary Examiner* — Scott B Geyer
(74) *Attorney, Agent, or Firm* — White & Case LLP

(57) ABSTRACT

According to one embodiment, a method of manufacturing a semiconductor device. The method includes introducing an inert gas and a material gas into a predetermined space, applying a voltage to generate plasma in the space after introducing the inert gas and the material gas so as to form a semiconductor layer on a substrate, introducing an oxidation-reduction gas in the predetermined space after the voltage is applied, and stopping the introduction of the material gas, the inert gas, and the oxidation-reduction gas after the voltage is applied.

15 Claims, 6 Drawing Sheets

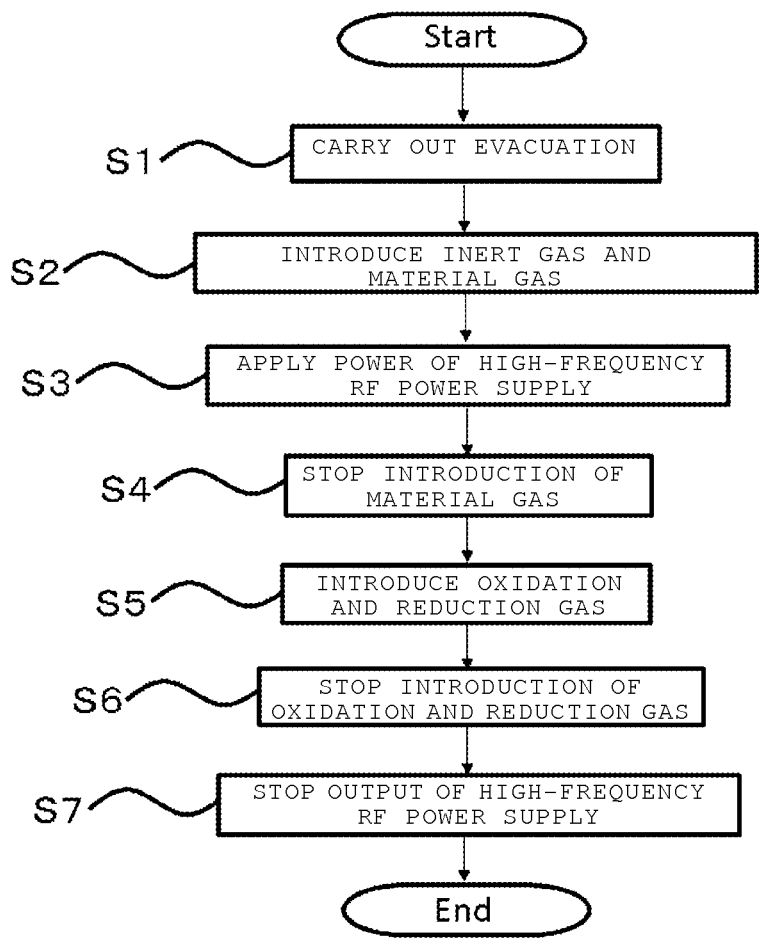

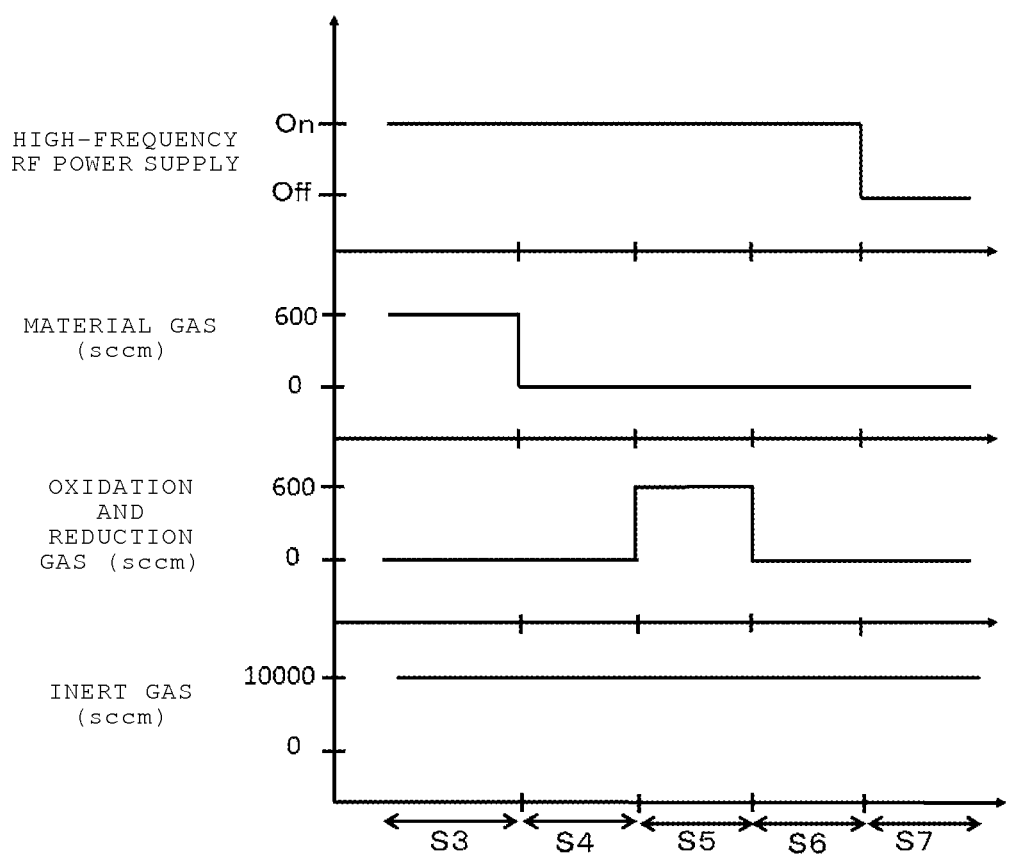

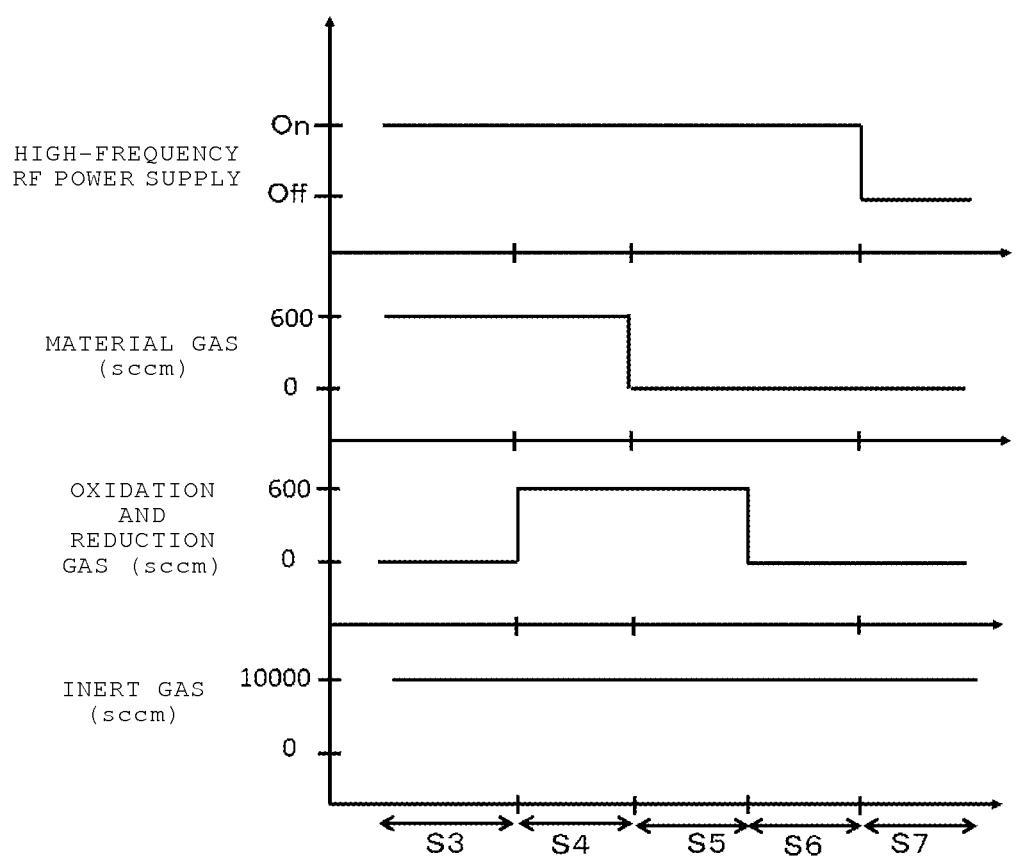

METHOD OF MANUFACTURING SEMICONDUCTOR DEVICE USING INERT, MATERIAL, AND OXIDATION-REDUCTION GASES

CROSS-REFERENCE TO RELATED APPLICATION

This application is based upon and claims the benefit of priority from Japanese Patent Application No. 2013-205883, filed Sep. 30, 2013; the entire contents of which are incorporated herein by reference.

FIELD

Embodiments described herein relate generally to a method of manufacturing a semiconductor device.

BACKGROUND

Along with recent miniaturization in a semiconductor device, when fine particles that adhere onto a semiconductor wafer are present during a process of manufacturing the semiconductor device, the fine particles cause a problem in manufacturing of the semiconductor device, and thus a method of reducing a dust is required.

In a plasma chemical vapor deposition (CVD) process, when carrying out film formation without using an oxidation reaction, a process of forming a film onto an object to be processed is carried out in a plasma atmosphere by applying high-frequency power to a material gas, or the material gas and an inert gas. At this time, when the application of the high-frequency voltage is stopped after completion of the film formation process, as a countermeasure for fine particles (dust), the high-frequency voltage is shut off after stopping supply of the material gas. However, an abnormal reaction occurs in the material gas that remains inside a reaction container for an interval between supply stoppage of the material gas and application stoppage of the high-frequency voltage, and thus nano-sized fine particles are generated. When the fine particles are generated, these fine particles are deposited on the semiconductor device, and thus a desired pattern may not be obtained. As a result, a decrease in operation reliability and a decrease in a yield rate are caused. An example of related art includes JP-A-2010-168870.

DESCRIPTION OF THE DRAWINGS

FIG. 2 is a flowchart schematically illustrating a process of manufacturing the semiconductor device according to the first embodiment.

FIG. 3 is a timing chart schematically illustrating the process of manufacturing the semiconductor device according to the first embodiment.

FIG. 6 is a timing chart schematically illustrating the process of manufacturing the semiconductor device according to the second embodiment.

DETAILED DESCRIPTION

An object of the exemplary embodiments is to provide a method of manufacturing a semiconductor device, which improves reliability and a yield rate of a semiconductor device.

In general, according to one embodiment, there is provided a method of manufacturing a semiconductor device. The method includes introducing an inert gas and a material gas into a predetermined space, applying a voltage to generate plasma in the space after introducing the inert gas and the material gas so as to form a semiconductor layer on a substrate, introducing an oxidation-reduction gas in the predetermined space after the voltage is applied, and stopping the introduction of the material gas, the inert gas, and the oxidation-reduction gas after the voltage is applied.

(First Embodiment)

Figure 1:
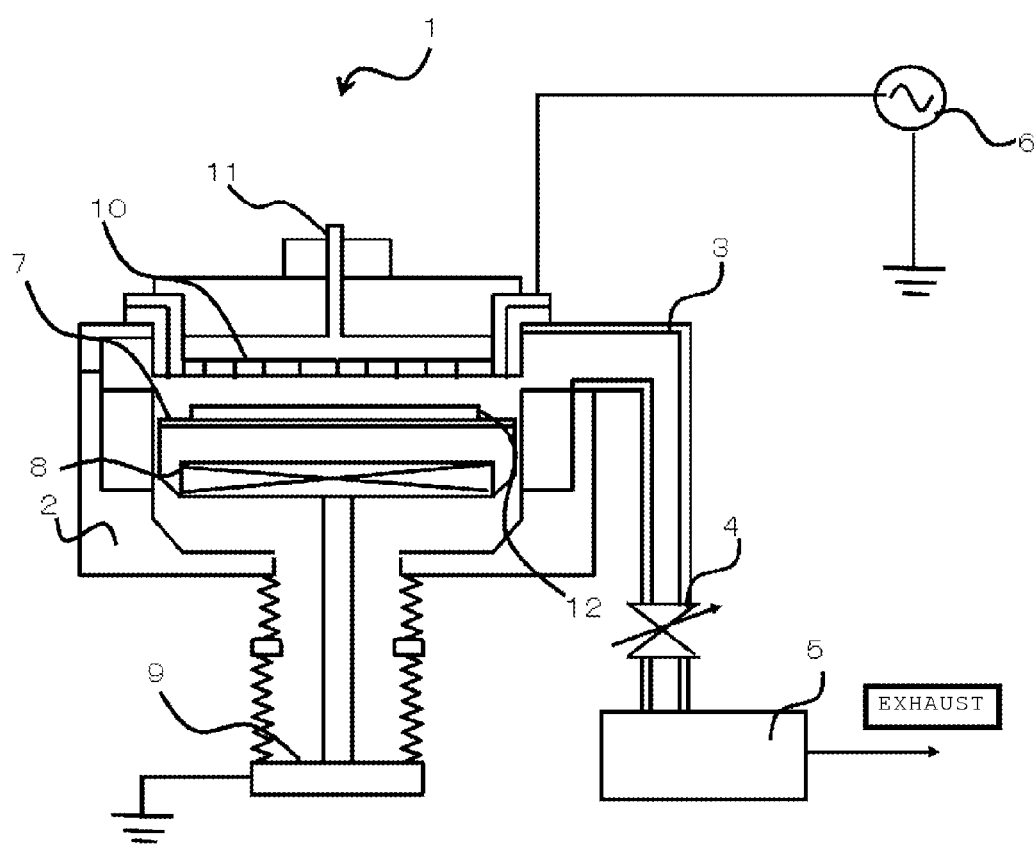
FIG. 1 is a schematic view illustrating a configuration of a semiconductor device according to a first embodiment.

First, description will be made with respect to a configuration of a semiconductor manufacturing apparatus 1 that is used in this embodiment. FIG. 1 is a schematic view illustrating a semiconductor device according to a first embodiment. For example, the semiconductor manufacturing apparatus 1 is a parallel plate type CVD apparatus, and includes a chamber 2, a vacuum pipe 3, a throttle valve 4, a dry pump 5, a high-frequency power supply 6, a high-frequency electrode 7, a substrate ground electrode 8, a heater 9, a gas distribution plate 10, and a material gas introduction unit 11. FIG. 1 shows a state in which a Si wafer 12 (substrate) is provided inside the chamber 2 of the semiconductor manufacturing apparatus 1.

The chamber 2 of the semiconductor manufacturing apparatus 1 is connected to the vacuum pipe 3 that communicates with the dry pump 5.

The vacuum pipe 3 is connected to the throttle valve 4, and a pressure inside the chamber is controlled by opening and closing of the throttle valve 4.

The dry pump 5 evacuates the inside of the chamber through the vacuum pipe. The dry pump 5 may carry out the evacuation to the order of $10^{-2}$ Torr to $10^{-3}$ Torr. In addition, the vacuum pump that is used is not limited to the dry pump.

The high-frequency power supply 6 is connected to the high-frequency electrode 7, and when a voltage is applied to the high-frequency electrode 7, plasma is generated between the high-frequency electrode 7 and the gas distribution plate 10.

The gas distribution plate 10 uniformly distributes an introduced gas in the chamber, and for example, a plurality of pores are provided to the gas distribution plate 10. In addition, the gas distribution plate 10 is connected to the high-frequency power supply 6, and serves as an upper high-frequency electrode.

The substrate ground electrode 8 may hold a Si wafer 12 as a susceptor. In addition, when a lift mechanism is provided, it is possible to control a distance between the gas distribution plate 10 that is the upper high-frequency electrode and a gas distribution plate 12.

The material gas introduction unit 11 is connected to the chamber 2. A material gas is introduced into the chamber through the material gas introduction unit 11.

A process of manufacturing the semiconductor device according to this embodiment will be described with reference to FIGS. 2 and 3. FIG. 2 is a flowchart schematically illustrating the process of manufacturing the semiconductor device according to the first embodiment. FIG. 3 is a timing chart schematically illustrating the process of manufacturing the semiconductor device according to the first embodiment.

In step S1, the inside of the chamber 2 is evacuated (step S1). For example, the evacuation is carried out to a degree of vacuum in the order of approximately $10^{-2}$ Torr to $10^{-3}$ Torr.

In step S2, the material gas and the inert gas are introduced into the chamber 2. As the material gas, for example, a $SiH_4$ gas is used, but there is no limitation to the $SiH_4$ gas. The material gas that is introduced is different depending on a target semiconductor device. As the inert gas, for example, a He gas is used, but there is no limitation to the He gas, and other inert gas such as an Ar gas, a Ne gas, and a Xe gas may be used. A flow rate of the material gas and the inert gas may be controlled by a mass flow controller (not shown), and the material gas and the inert gas are introduced into the chamber 2 under the following conditions. That is, the $SiH_4$ gas is introduced at a flow rate of 600 sccm, and the He gas is introduced at a flow rate of 10,000 sccm. A pressure inside the container is controlled to, for example, approximately 9 torr. The material gas and the inert gas are uniformly distributed from an introduction portion by the gas distribution plate 10, and are supplied into the chamber 2. In addition, an introduction sequence of the material gas and the inert gas does not matter.

In addition, in step S3, a semiconductor layer is formed (step S3). When forming the semiconductor layer, the high-frequency power supply 6 is set to an output mode to apply a voltage to a space between the high-frequency electrode 7 and the gas distribution plate 10. Power that is output by the high-frequency power supply 6 is, for example, 200 W. According to this, plasma is generated between the high-frequency electrode 7 and the gas distribution plate 10. The material gas reacts with the plasma and forms a semiconductor layer (amorphous silicon) on the Si wafer 12, for example, in a thickness of approximately 100 nm.

In step S4, the introduction of the material gas from the material gas introduction unit 11 is stopped (step S4). That is, after preparation of the semiconductor layer completed, the introduction of the $SiH_4$ gas is stopped in a state the voltage is applied to the space between the high-frequency electrode 7 and the gas distribution plate 10. According to this, the formation of the semiconductor layer is stopped.

In step S5, an oxidation-reduction gas is introduced into the chamber 2 (step S5). The oxidation-reduction gas is a gas containing at least one of $N_2$, $O_2$, CO, $CO_2$, NO, $NO_2$, and $NH_3$. The oxidation-reduction gas reacts with the material gas and energy of plasma in a remaining vapor phase to form fine particles such as SiO, $SiO_2$, SiNH, and $SiNH_2$. Here, the oxidation-reduction reaction represents a reaction by charge exchange. The fine particles that are formed are charged, are trapped by plasma, and are present in the vapor phase without being deposited on the substrate. Then, the fine particles are exhausted to the outside of the chamber 2. Accordingly, the fine particles that are formed are not deposited on the semiconductor layer.

In step S5, the introduction of the oxidation-reduction gas is carried out after stoppage of the material gas introduction, but it is preferable that a time from the stoppage of the material gas introduction to the introduction of the oxidation-reduction gas be as short as possible. That is, the introduction of the oxidation-reduction gas and the stoppage of the material gas introduction may be carried out simultaneously with each other. This is because the following phenomenon is suppressed. That is, after stoppage of the material gas introduction, when the material gas itself that remains inside the chamber and the plasma in the remaining vapor phase abnormally react with each other, fine particles are formed, and the fine particles are deposited on the semiconductor layer without being trapped by the plasma.

In step S6, the introduction of the oxidation-reduction gas is stopped (step S6). In addition, the introduction of the inert gas is stopped as necessary.

In step S7, output of the high-frequency power supply is stopped, and the process of manufacturing the semiconductor device is terminated (step S7).

An effect of the method of manufacturing the semiconductor device according to this embodiment will now be described.

According to the method of manufacturing the semiconductor device according to this embodiment, after forming the semiconductor layer, it is possible to suppress the fine particles from putting on the semiconductor layer or being embedded in the semiconductor layer.

When the fine particles are put on the semiconductor layer, a resist layer, which is to be formed on the semiconductor layer, is formed in a region other than a region on which the fine particles are put. Therefore, a normal pattern by the resist layer may not be formed on the region, and thus this has a great effect on a pattern of the semiconductor layer which is formed by finally etching the resist layer.

According to the method of manufacturing the semiconductor device of this embodiment, the fine particles are prevented from being formed and the fine particles are prevented from putting on the semiconductor layer, and thus pattern failure of the semiconductor layer is prevented from occurring. As a result, reliability of the semiconductor device is improved. In addition, failure is prevented from occurring in the semiconductor device and thus a desired semiconductor layer pattern may be easily obtained. As a result, a yield rate of the semiconductor device is also improved.

Figure 4A:
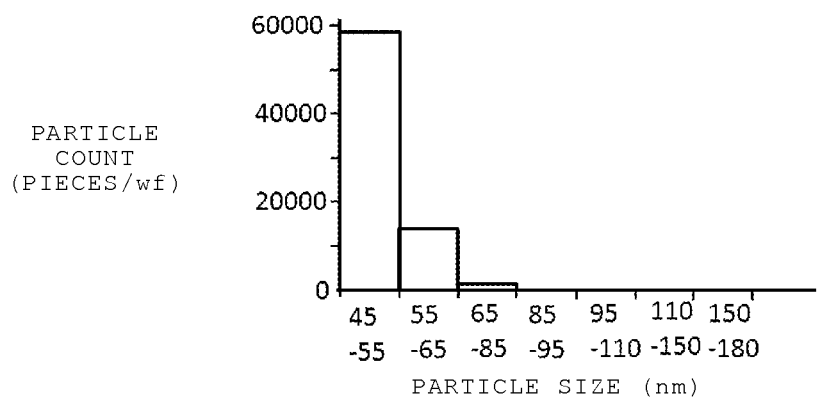
FIGS. 4A and 4B are views illustrating comparative examples of the first embodiment.
Figure 4B:
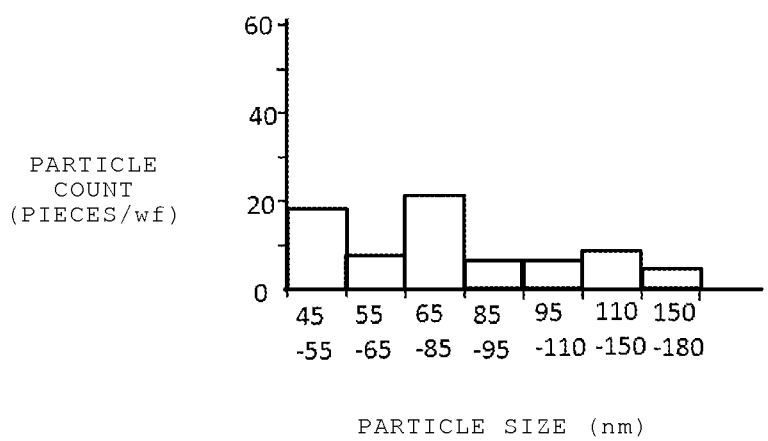

As a comparative example, an examination will be made with respect to a configuration in which the semiconductor layer is formed by introducing the oxidation-reduction gas, and a configuration in which the semiconductor layer is formed without introducing the oxidation-reduction gas. FIGS. 4A and 4B are views illustrating the number and size of the fine particles that are put on the semiconductor layer when using the oxidation-reduction gas, and when not using the oxidation-reduction gas. The horizontal axis shows the size of the fine particles, and the vertical axis shows the number of the fine particles. As shown in FIG. 4A, when not introducing the oxidation-reduction gas, the number of fine particles that are put on the semiconductor layer exceeds 50,000 with regard to a size of 45 nm to 55 nm, and exceeds 10,000 with regard to a size of 55 nm to 65 nm. In contrast, as shown in FIG. 4B, when introducing the oxidation-reduction gas, an approximately several tens of fine particles are put on the semiconductor layer. Accordingly, when the oxidation-reduction gas is introduced, generation of the fine particles is greatly suppressed, and the putting of the fine particles on the semiconductor layer may be suppressed.

(Second Embodiment)

A method of manufacturing a semiconductor device according to a second embodiment is different from the method of manufacturing the semiconductor device according to the first embodiment in that the oxidation-reduction gas is introduced before a film forming process is terminated, and a wet-processing process of removing an oxide film or a nitride film is provided. That is, the introduction of the oxidation-reduction gas is stopped in step S4, the introduction of the material gas is stopped in step S5, and a wet process is carried out in step S8. The other processes are the same as the first embodiment, and the configuration of the semiconductor manufacturing apparatus 1 is similar to the configuration of the first embodiment.

Figure 5:
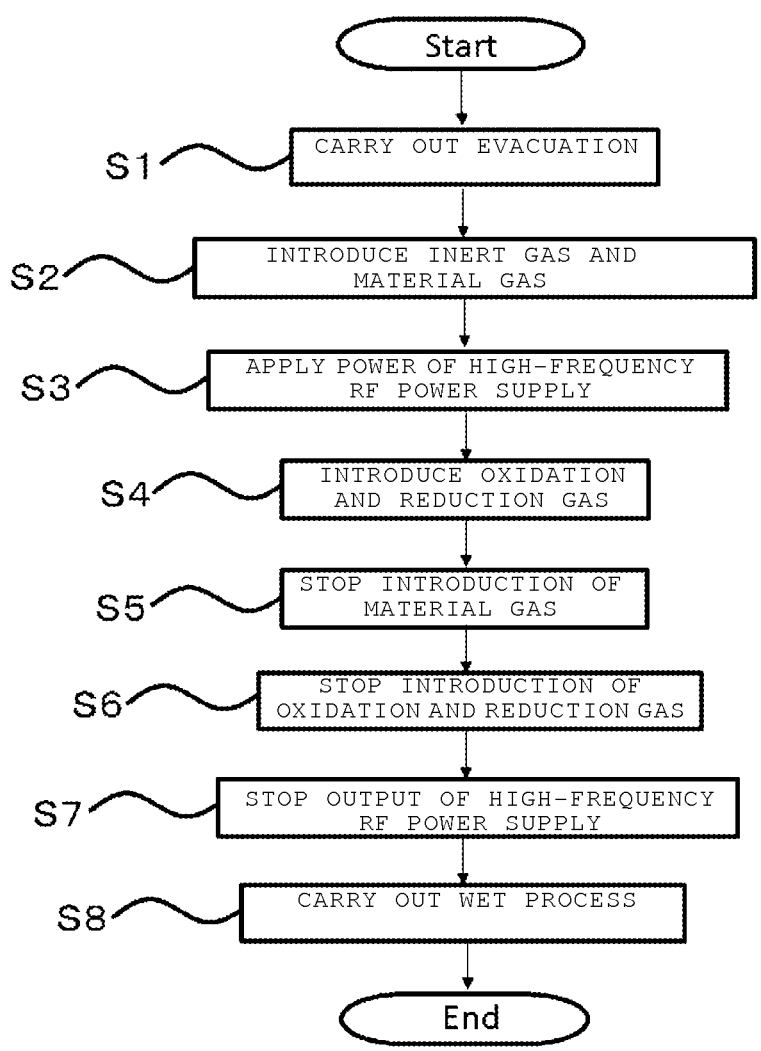
FIG. 5 is a flowchart schematically illustrating a process of manufacturing a semiconductor device according to a second embodiment.

FIG. 5 is a flowchart schematically illustrating a process of manufacturing the semiconductor device according to the second embodiment. FIG. 6 is a timing chart schematically illustrating the process of manufacturing the semiconductor device according to the second embodiment.

As shown in FIG. 5, the same processes as the first embodiment are carried out in step S1 to step S3, and in step S4, the oxidation-reduction gas is introduced into the chamber 2 (step S4). According to this, the oxidation-reduction gas reacts with the material gas and the plasma in the vapor phase to form an oxide. The oxide is deposited on the semiconductor layer, and as a result, an oxide layer is formed on the semiconductor layer. At this time, the material gas is also simultaneously supplied, and thus the oxide layer contains elements that constitute the semiconductor layer. For example, the thickness of the oxide layer is preferably 10 nm to 100 nm. The oxide layer is removed by the following wet process. However, when the oxide layer is too thick, a lot of time is taken to remove the oxide layer. In addition, when the oxide layer is too thin, not only the oxide layer but also the semiconductor layer is cut out. Therefore, when the thickness of the oxide layer is set in the above-described range, it is easy to control the thickness of the semiconductor device including the semiconductor layer in the wet process.

In addition, the oxidation-reduction gas may form a nitride instead of the oxide by components. In this case, a nitride layer is formed on the semiconductor layer.

In step S5, the introduction of the material gas is stopped (step S5). When stopping the supply of the material gas that becomes a raw material of the oxide layer, the oxide layer is not formed any more.

In step S6, the introduction of the oxidation-reduction gas is stopped (step S6).

In step S7, the output of the high-frequency power supply 6 is stopped (step S7).

In step S8, the semiconductor device is taken out from the semiconductor manufacturing apparatus 1, and is subjected to the wet process. According to this, the oxide layer formed on the semiconductor layer is removed (step S8). When using an O-containing gas as the oxidation-reduction gas, for example, an oxide layer including $SiO_2$ is formed on the semiconductor layer as the oxide layer. In this case, it is possible to remove the oxide layer by carrying out the wet process by immersing the semiconductor device in a hydrofluoric acid solution (DHF) (step S8).

On the other hand, when using an N-containing gas as the oxidation-reduction gas, a nitride layer including SiN is formed on the semiconductor layer as the nitride layer. In this case, the semiconductor device is subjected to the wet process using a solution including phosphoric acid. When carrying out the wet-processing process using the solution including the phosphoric acid, it is possible to selectively remove the nitride layer (step S8).

An effect of the method of manufacturing the semiconductor device according to this embodiment will now be described. In the method of manufacturing the semiconductor device according to this embodiment, after forming the semiconductor layer, the fine particles are removed while forming the oxide layer or the nitride layer.

In the method of manufacturing the semiconductor device according to this embodiment, the oxidation-reduction gas is introduced before stopping the voltage application to a space between the high-frequency electrode 7 and the gas distribution plate 10, and thus the oxidation-reduction gas, the material gas, and the plasma react with each other to form the oxide layer on the semiconductor layer. The fine particles are put on the oxide layer, or the fine particles are embedded in the oxide layer or the nitride layer. After forming the oxide layer or the nitride layer, when the wet-processing process is carried out for each oxide layer or nitride layer to remove the oxide layer or the nitride layer, an effect of removing the fine particles may be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   introducing an inert gas and a material gas into a predetermined space;
   applying a voltage to generate plasma in the space after introducing the inert gas and the material gas to form a semiconductor layer on a substrate;
   introducing an oxidation-reduction gas in the predetermined space after the voltage is applied, the oxidation-reduction gas reacts with the plasma and forms fine particles; and
   stopping the introduction of the material gas, the inert gas, and the oxidation-reduction gas after the voltage is applied.

2. The method according to claim 1,
   wherein the oxidation-reduction gas is introduced simultaneously with or after introducing the material gas is stopped.

3. The method according to claim 1,
   wherein the introduction of the oxidation-reduction gas is carried out before the stoppage of the material gas introduction to form an oxide film or a nitride film on the semiconductor layer, and
   the method further comprises wet-processing of removing the oxide film or the nitride film that is formed on the semiconductor layer.

4. The method according to claim 1,
   wherein the fine particles are charged.

5. The method according to claim 1,
   wherein performing vacuum and evacuate the fine particles from the predetermined space.

6. The method according to claim 1,
   wherein the fine particles contains at least one of SiO, $SiO_2$, SiNH or $SiNH_2$.

7. The method according to claim 1,
   wherein the oxidation-reduction gas contains at least one of N2, O2, CO, CO2, NO, NO2, and NH3.

8. The method according to claim 1,
   wherein the material gas contains $SiH_4$.

9. The method according to claim 1,
   wherein the thickness of the oxide film is 10 nm 100 nm.

10. The method according to claim 1,
    wherein a thickness of the semiconductor layer is about 100 nm.

11. The method according to claim 1, wherein the semiconductor layer contains amorphous silicon.

12. The method according to claim 1,
    wherein the inert gas contains at least one of He, Ar, Ne and Xe.

13. A method of manufacturing a semiconductor device, comprising:
- introducing an inert gas and a material gas into a predetermined space;
- applying a voltage to generate plasma in the space after introducing the inert gas and the material gas to form a semiconductor layer on a substrate;
- introducing an oxidation-reduction gas in the predetermined space after the voltage is applied, the introduction of the oxidation-reduction gas being carried out before a stoppage of the material gas introduction to form an oxide film or a nitride film on the semiconductor layer;
- stopping the introduction of the material gas, the inert gas, and the oxidation-reduction gas after the voltage is applied; and
- wet-processing of removing the oxide film or the nitride film that is formed on the semiconductor layer.

14. The method according to claim 13,
wherein the nitride film contains SiN.

15. The method according to claim 13,
wherein wet-processing of removing the oxide film or the nitride film is performed by using liquid which contain phosphoric acid.

* * * * *